United States Patent
Hsu et al.

(10) Patent No.: US 11,152,566 B2
(45) Date of Patent: Oct. 19, 2021

(54) RESISTIVE RANDOM ACCESS MEMORY

(71) Applicant: Winbond Electronics Corp., Taichung (TW)

(72) Inventors: Po-Yen Hsu, Taichung (TW); Bo-Lun Wu, Taichung (TW); Ping-Kun Wang, Taichung (TW); Ming-Che Lin, Taichung (TW); Yu-Ting Chen, Taichung (TW); Chang-Tsung Pai, Taichung (TW); Shao-Ching Liao, Taichung (TW); Chi-Ching Liu, Taichung (TW)

(73) Assignee: Winbond Electronics Corp., Taichung (TW)

(*) Notice: Subject to any disclaimer, the term of this patent is extended or adjusted under 35 U.S.C. 154(b) by 7 days.

(21) Appl. No.: 16/709,863

(22) Filed: Dec. 10, 2019

(65) Prior Publication Data
US 2021/0175418 A1  Jun. 10, 2021

(51) Int. Cl.
*H01L 45/00* (2006.01)

(52) U.S. Cl.
CPC .......... *H01L 45/08* (2013.01); *H01L 45/1233* (2013.01); *H01L 45/1253* (2013.01)

(58) Field of Classification Search
CPC .. H01L 45/08; H01L 45/1233; H01L 45/1253
See application file for complete search history.

(56) References Cited

U.S. PATENT DOCUMENTS

| | | | |
|---|---|---|---|
| 9,306,160 B2* | 4/2016 | Chiang | .................. H01L 45/12 |
| 9,960,350 B2 | 5/2018 | Ha | |
| 2010/0243983 A1 | 9/2010 | Chiang et al. | |
| 2013/0334483 A1 | 12/2013 | Ramaswamy et al. | |
| 2015/0188039 A1 | 7/2015 | Wang et al. | |
| 2015/0188045 A1 | 7/2015 | Wang et al. | |
| 2015/0287914 A1 | 10/2015 | Ho et al. | |

FOREIGN PATENT DOCUMENTS

WO   2016111724   7/2016

OTHER PUBLICATIONS

"Office Action of Taiwan Counterpart Application", dated May 25, 2020, p. 1-p. 6.

* cited by examiner

*Primary Examiner* — Mark V Prenty
(74) *Attorney, Agent, or Firm* — JCIPRNET

(57) ABSTRACT

A resistive random access memory including first and second electrodes, a resistance variable layer, first and second metal layers and a resistance stabilizing layer is provided. The second electrode is disposed on the first electrode. The resistance variable layer is disposed between the first and second electrodes. The first metal layer is disposed between the resistance variable layer and the second electrode. The second metal layer is disposed between the first metal layer and the second electrode. The resistance stabilizing layer is disposed between the first and second metal layers. The oxygen content of the resistance variable layer is higher than that of the first metal layer, the oxygen content of the first metal layer is higher than that of the resistance stabilizing layer, the oxygen content of the resistance stabilizing layer is higher than that of the second metal layer.

19 Claims, 1 Drawing Sheet

RESISTIVE RANDOM ACCESS MEMORY

BACKGROUND

Technical Field

The present invention relates to a memory, and in particular to a resistive random access memory (RRAM).

Description of Related Art

RRAM has the advantages of fast operation speed and low power consumption, and has become a widely studied non-volatile memory in recent years. However, RRAM is difficult to return to a high resistance state in an increasingly high probability after repeated SET/RESET cycle operations, which limits durability and data retention capability. Therefore, how to improve the durability and data retention capability of RRAM is an active goal of the industry.

SUMMARY

The present invention provides a resistive random access memory having good durability, good reset characteristics, and good data retention capability.

The resistive random access memory of the present invention includes a first electrode, a second electrode, a resistance variable layer, a first metal layer, a second metal layer, and a resistance stabilizing layer. The second electrode is disposed on the first electrode. The resistance variable layer is disposed between the first electrode and the second electrode. The first metal layer is disposed between the resistance variable layer and the second electrode. The second metal layer is disposed between the first metal layer and the second electrode. The resistance stabilizing layer is disposed between the first metal layer and the second metal layer. The oxygen content of the resistance variable layer is higher than the oxygen content of the first metal layer, the oxygen content of the first metal layer is higher than the oxygen content of the resistance stabilizing layer, and the oxygen content of the resistance stabilizing layer is higher than the oxygen content of the second metal layer.

Based on the above, the resistive random access memory of the present invention includes a first electrode, a second electrode, a resistance variable layer, a first metal layer, a second metal layer, and a resistance stabilizing layer, wherein the oxygen content of the resistance variable layer is higher than the oxygen content of the first metal layer, the oxygen content of the first metal layer is higher than the oxygen content of the resistance stabilizing layer, and the oxygen content of the resistance stabilizing layer is higher than the oxygen content of the second metal layer, thereby even the resistance variable layer of the resistive random access memory is damaged to generate additional oxygen vacancies (i.e., defects) due to the multiple set/reset cycle operations, when the resistive random access memory is reset, sufficient oxygen ions in the first metal layer can quickly enter the resistance variable layer, so that the resistance variable layer can be smoothly converted to the high resistance state (HRS). In this way, the resistive random access memory of the present invention can have good durability, good reset characteristics, and good data retention capability.

In order to make the aforementioned features and advantages of the disclosure more comprehensible, embodiments accompanied with figures are described in detail below.

DESCRIPTION OF THE EMBODIMENTS

Exemplary embodiments of the present invention will be described more fully hereinafter with reference to the accompanying drawings; however, the invention may be embodied in various forms and not limited to the embodiments set forth herein.

Figure 1:
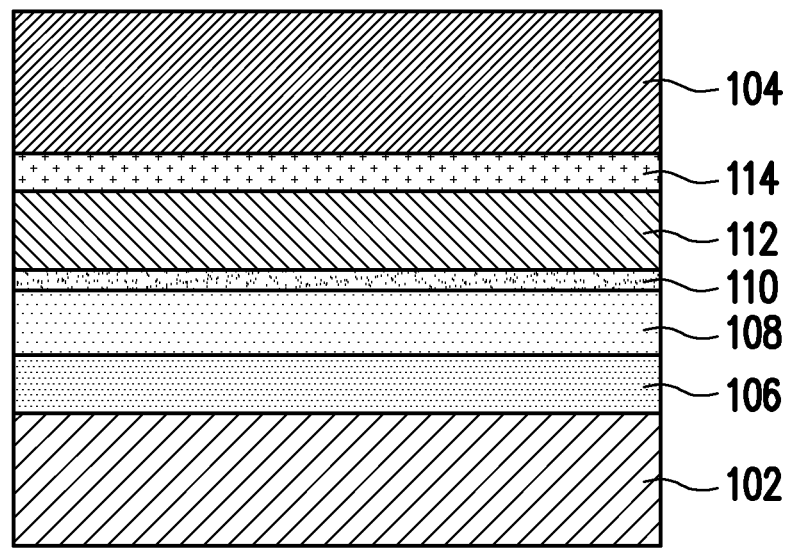
FIG. 1 is a schematic cross-sectional view of a resistive random access memory in accordance with an embodiment of the present invention.
Figure 2:
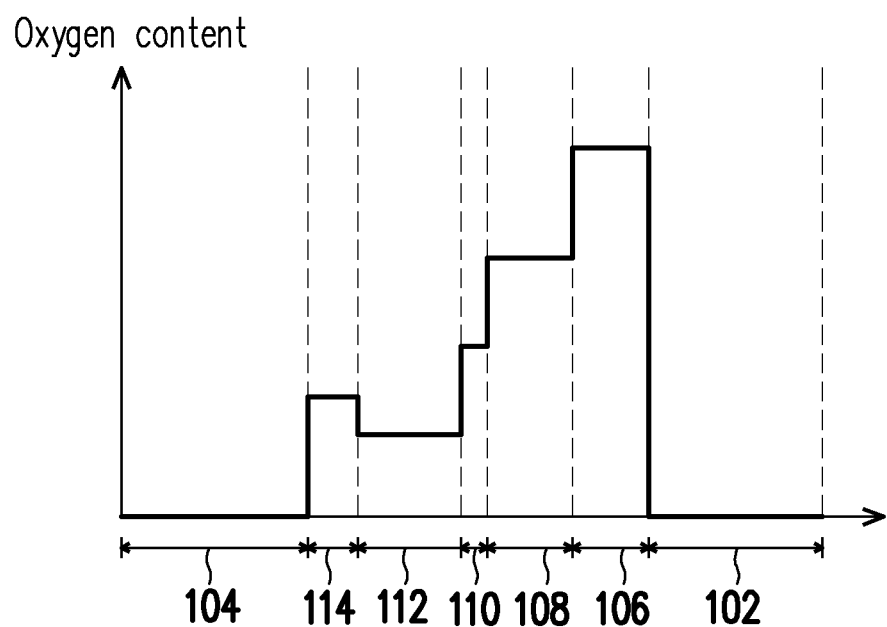
FIG. 2 is a schematic diagram showing a distribution of oxygen content of a resistive random access memory according to an embodiment of the present invention as a function of position.

FIG. 1 is a schematic cross-sectional view of a resistive random access memory in accordance with an embodiment of the present invention. FIG. 2 is a schematic diagram showing a distribution of oxygen content of a resistive random access memory according to an embodiment of the present invention as a function of position.

Referring to FIG. 1, a resistive random access memory 100 includes a first electrode 102, a second electrode 104, a resistance variable layer 106, a first metal layer 108, a resistance stabilizing layer 110, a second metal layer 112, and a barrier layer 114.

The material of the first electrode 102 is not particularly limited, and any conductive material can be used. For example, the material of the first electrode 102 may be titanium nitride (TiN), tantalum nitride (TaN), titanium aluminum nitride (TiAlN), titanium-tungsten alloy, tungsten (W), ruthenium (Ru), platinum (Pt), iridium (Ir), graphite or a mixture or laminate of the above materials. Preferably, the material of the first electrode 102 may be titanium nitride, tantalum nitride, platinum, iridium, graphite or a combination thereof. The method of forming the first electrode 102 is not particularly limited, and is commonly performed by physical vapor deposition (PVD) or chemical vapor deposition (CVD). The thickness of the first electrode 102 is also not particularly limited, but is usually between 5 nm and 500 nm.

The second electrode 104 is disposed on the first electrode 102. The material of the second electrode 104 is not particularly limited, and any conductive material can be used. For example, the material of the second electrode 104 may be titanium nitride (TiN), tantalum nitride (TaN), titanium aluminum nitride (TiAlN), titanium-tungsten alloy, tungsten (W), ruthenium (Ru), platinum (Pt), iridium (Ir), graphite or a mixture or laminate of the above materials. Preferably, the material of the second electrode 104 may be titanium nitride, tantalum nitride, platinum, iridium, graphite or a combination thereof. The method of forming the second electrode 104 is not particularly limited, and is commonly performed by physical vapor deposition, chemical vapor deposition, or atomic layer deposition. The thickness of the second electrode 104 is also not particularly limited, but is usually between 5 nm and 500 nm.

The resistance variable layer 106 is disposed between the first electrode 102 and the second electrode 104. The material of the resistance variable layer 106 is not particularly limited, and any material of which the resistance is changed when a voltage is applied can be used. In the present embodiment, the material of the resistance variable layer 106 includes, for example, hafnium oxide ($HfO_2$), tantalum oxide ($Ta_2O_5$), titanium oxide ($TiO_2$), magnesium oxide (MgO), nickel oxide (NiO), niobium oxide ($Nb_2O_5$), aluminium oxide ($Al_2O_3$), vanadium oxide ($V_2O_5$), tungsten oxide ($WO_3$), zinc oxide (ZnO) or cobalt oxide (CoO). In detail, the resistance variable layer 106 may have the following characteristic. When a positive bias is applied to the resistive random access memory 100, oxygen ions in the resistance variable layer 106 are attracted by the positive bias to leave the resistance variable layer 106, such that oxygen vacancies are generated, a filament structure is formed and the filament structure is in a conductive states, in which case the resistance variable layer 106 is converted from a high resistance state (HRS) to a low resistance state (LRS). And, when a negative bias is applied to the resistive random access memory 100, oxygen ions return to the resistance variable layer 106, thereby the filament structure is broken and is in a non-conductive state, in which case the resistance variable layer 106 is converted from the LRS to the HRS. In general, the conversion of the resistance variable layer 106 from the HRS to the LRS is referred to as a set (hereinafter referred to as SET) operation, and the conversion of the resistance variable layer 106 from the LRS to the HRS is referred to as a reset (hereinafter referred to as RESET) operation. In addition, in the present embodiment, the resistance variable layer 106 may have an oxygen content of about 75 atomic percent (at %) to about 100 at %. In an embodiment, the resistance variable layer 106 may be formed by physical vapor deposition or chemical vapor deposition. In another embodiment, it is considered that the thickness of the resistance variable layer 106 is usually limited to a very thin range (for example, 2 nm to 10 nm), and the resistance variable layer 106 may be formed by atomic layer deposition.

The first metal layer 108 is disposed between the resistance variable layer 106 and the second electrode 104. In the present embodiment, the material of the first metal layer 108 may be a material that is more easily to be bonded with oxygen than the resistance variable layer 106. In this way, when the resistive random access memory 100 performs a SET operation, the oxygen ions leaving the resistance variable layer 106 due to attraction from the positive bias enter the first metal layer 108; and when the resistive random access memory 100 performs a RESET operation, oxygen ions in the first metal layer 108 return to the resistance variable layer 106.

As shown in FIG. 2, the oxygen content of the resistance variable layer 106 is higher than the oxygen content of the first metal layer 108. In the present embodiment, the first metal layer 108 may have an oxygen content of about 70 at % to about 85 at %. The oxygen content of the first metal layer 108 is within the foregoing range, thereby enhancing the ability of the oxygen ions to return to the resistance variable layer 106.

In the present embodiment, the material of the first metal layer 108 may include an incompletely oxidized metal oxide. In other words, the first metal layer 108 itself is a metal layer containing oxygen ions. In this way, when the resistive random access memory 100 performs a RESET operation, sufficient oxygen ions in the first metal layer 108 can enter the resistance variable layer 106 because the first metal layer 108 is present with the oxygen ions from the resistance variable layer 106 and the inherent oxygen ions. Specifically, in the present embodiment, the material of the first metal layer 108 may include, for example, $TiO_{2-x}$, $HfO_{2-x}$, or $TaO_{2-x}$, where x is 0.2 to 0.7.

In the embodiment, the method for forming the first metal layer 108 may include the following steps: after forming a metal material layer (not shown) on the resistance variable layer 106, doping the metal material layer with oxygen ions. The material of the metal material layer may include titanium (Ti), hafnium (HO or tantalum (Ta). The method for forming the metal material layer is not particularly limited, and is commonly performed by physical vapor deposition or chemical vapor deposition. The method of doping the metal material layer with oxygen ions is, for example, ionized metal plasma (IMP) or thermal diffusion method. In an embodiment in which the metal material layer is doped with oxygen ions by IMP, the doping energy of the oxygen ions is greater than about 7 kV to less than about 10 kV, whereby the oxygen ions are only doped to the metal material layer on the resistance variable layer 106, and are not doped to the resistance variable layer 106. In an embodiment in which the metal material layer is doped with oxygen ions by a thermal diffusion method, the process temperature is from about 250° C. to about 400° C., and the dopant concentration (i.e., oxygen ion concentration) is from about $10E3/cm^2$ to about $10E5/cm^2$, whereby oxygen ions are only doped to the metal material layer on the resistance variable layer 106, and are not doped to the resistance variable layer 106.

In addition, in the present embodiment, the thickness of the first metal layer 108 is, for example, about 10 nm to about 50 nm. The thickness of the first metal layer 108 is within the foregoing range, such that oxygen ions can quickly enter the resistance variable layer 106 when the resistive random access memory 100 performs a RESET operation, thereby improving the reset characteristics.

The resistance stabilizing layer 110 is disposed between the first metal layer 108 and the second electrode 104. In the present embodiment, the resistance stabilizing layer 110 may be used to block oxygen ions in the first metal layer 108 from diffusing to the second metal layer 112 (the related description is described below) to avoid unstable resistance. In the present embodiment, the thickness of the resistance stabilizing layer 110 is, for example, about 0.3 nm to about 10 nm. In the present embodiment, the method of forming the resistance stabilizing layer 110 is, for example, chemical vapor deposition, physical vapor deposition, or atomic layer deposition. In the present embodiment, the resistance value of the resistance stabilizing layer 110 is, for example, about 0.5 ohm to 5 ohm.

As shown in FIG. 2, the oxygen content of the first metal layer 108 is higher than the oxygen content of the resistance stabilizing layer 110. In the present embodiment, the oxygen stabilizing layer 110 may have an oxygen content of about 20 at % to about 60 at %. The oxygen content of the resistance stabilizing layer 110 is within the foregoing range, whereby the amount of oxygen ions diffusing to the second metal layer 112 can be controlled. In the present embodiment, the material of the resistance stabilizing layer 110 may include, for example, metal oxynitride. Specifically, the metal oxynitride includes, for example, tantalum oxynitride, hafnium oxynitride or titanium oxynitride. In addition, in the present embodiment, the nitrogen content of the resistance stabilizing layer 110 may be about 30 at % to about 50 at %.

The second metal layer 112 is disposed between the resistance stabilizing layer 110 and the second electrode 104. In detail, as shown in FIG. 1, the second metal layer 112 is disposed between the first metal layer 108 and the second electrode 104, and the resistance stabilizing layer 110 is disposed between the first metal layer 108 and the second metal layer 112.

In the present embodiment, the material of the second metal layer 112 may include, for example, Ta, Hf or Ti. In the present embodiment, the thickness of the second metal layer 112 is, for example, about 10 nm to about 50 nm. In the present embodiment, the method of forming the second metal layer 112 is, for example, physical vapor deposition. As shown in FIG. 2, the oxygen content of the resistance stabilizing layer 110 is higher than that of the second metal layer 112. In the present embodiment, the second metal layer 112 may have an oxygen content of about 10 at % to about 40 at %. The oxygen content of the second metal layer 112 is within the foregoing range, whereby the oxygen content of the first metal layer 108 can be regulated. It is worth mentioning that in the process of forming the second metal layer 112 by physical vapor deposition, oxygen is still generally introduced, so even if the desired second metal layer 112 to be formed is a pure metal layer (for example, a Ta layer, a Hf layer or a Ti layer), the formed second metal layer 112 still contains oxygen.

In addition, in the present embodiment, the atomic number of the metal in the second metal layer 112 may be greater than the atomic number of the metal in the first metal layer 108. At this time, the oxygen affinity of the metal in the second metal layer 112 is smaller than the oxygen affinity of the metal in the first metal layer 108. In this way, when the resistive random access memory 100 performs a RESET operation, the amount of oxygen ions diffusing to the second metal layer 112 can be controlled not only by using the resistance stabilizing layer 110 capable of blocking oxygen ions in the first metal layer 108 from diffusing to the second metal layer 112 in the resistive random access memory 100, but also by selecting the materials of the second metal layer 112 and the first metal layer 108 to reduce the attraction of the second metal layer 112 to oxygen ions. For example, in one embodiment, when the material of the second metal layer 112 includes Ta, the material of the first metal layer 108 may be $TiO_{2-x}$ or $HfO_{2-x}$; in another embodiment, when the material of the second metal layer 112 includes Hf, the material of the first metal layer 108 may be $TiO_{2-x}$.

Further, as described above, in the resistive random access memory 100, the oxygen content of the resistance variable layer 106 is higher than the oxygen content of the first metal layer 108, the oxygen content of the first metal layer 108 is higher than the oxygen content of the resistance stabilizing layer 110, and the oxygen content of the resistance stabilizing layer 110 is higher than the oxygen content of the second metal layer 112, whereby the resistance variable layer 106, the first metal layer 108, the resistance stabilizing layer 110 and the second metal layer 112 together form a gradient of oxygen content, as shown in FIG. 2. The resistive random access memory 100 has the gradient of oxygen content, thereby oxygen ions in the first metal layer 108 can quickly enter the resistance variable layer 106 when the resistive random access memory 100 performs a RESET operation, and even the resistance variable layer 106 of the resistive random access memory 100 is damaged to generate additional oxygen vacancies (i.e., defects) due to the multiple SET/RESET cycle operations, when the resistive random access memory 100 performs a RESET operation, the first metal layer 108 can provide sufficient oxygen ions into the resistance variable layer 106 to break the filament structure and render the filament structure in a non-conductive state, which means that the resistance variable layer 106 can be converted to the HRS. As a result, the resistive random access memory 100 can have good durability, good reset characteristics, and good data retention capability.

The barrier layer 114 is disposed between the second metal layer 112 and the second electrode 104. In the present embodiment, the thickness of the barrier layer 114 is, for example, about 0.5 nm to about 5 nm. In the present embodiment, the material of the barrier layer 114 may include, for example, aluminum oxide ($Al_2O_3$), hafnium oxide ($HfO_2$), or zirconium oxide ($ZrO_2$). In the present embodiment, the formation method of the barrier layer 114 is, for example, chemical vapor deposition or atomic layer deposition. When the resistive random access memory 100 performs a RESET operation, the barrier layer 114 blocks oxygen ions in the second metal layer 112 from diffusing to the second electrode 104.

It should be noted that, as described above, in the resistive random access memory 100, the second electrode 104 is disposed on the first electrode 102, the resistance variable layer 106 is disposed between the first electrode 102 and the second electrode 104, the first metal layer 108 is disposed between the resistance variable layer 106 and the second electrode 104, the second metal layer 112 is disposed between the first metal layer 108 and the second electrode 104, the resistance stabilizing layer 110 is disposed between the first metal layer 108 and the second metal layer 112, and the resistance variable layer 106, the first metal layer 108, the resistance stabilizing layer 110 and the second metal layer 112 together form a gradient of oxygen content, whereby the resistive random access memory 100 can not only perform the SET/RESET cycle operations, but even in the case that the resistance variable layer 106 of the resistive random access memory 100 is damaged to generate additional oxygen vacancies (i.e., defects) due to the multiple SET/RESET cycle operations, when the resistive random access memory 100 performs a RESET operation, sufficient oxygen ions in the first metal layer 108 can quickly enter the resistance variable layer 106 to break the filament structure and render the filament structure in a non-conductive state, which means that the resistance variable layer 106 can be converted to the HRS. As a result, the resistive random access memory 100 can have good durability, good reset characteristics, and good data retention capability.

Although the present invention has been disclosed in the above embodiments, it is not intended to limit the invention, and those skilled in the art can make some modifications and refinements without departing from the spirit and scope of the invention. Therefore, the scope of protection of the present invention is subject to the definition of the scope of the appended patent application.

What is claimed is:

1. A resistive random access memory comprising:
   a first electrode;
   a second electrode disposed on the first electrode;
   a resistance variable layer disposed between the first electrode and the second electrode;
   a first metal layer disposed between the resistance variable layer and the second electrode;
   a second metal layer disposed between the first metal layer and the second electrode, wherein an atomic number of a metal in the second metal layer is greater than an atomic number of a metal in the first metal layer; and
   a resistance stabilizing layer disposed between the first metal layer and the second metal layer, wherein an oxygen content of the resistance variable layer is higher than an oxygen content of the first metal layer, the oxygen content of the first metal layer is higher than an oxygen content of the resistance stabilizing layer, and the oxygen content of the resistance stabilizing layer is higher than an oxygen content of the second metal layer.

2. The resistive random access memory of claim 1, wherein a material of the first metal layer comprises $TiO_{2-x}$, $HfO_{2-x}$ or $TaO_{2-x}$, wherein x is 0.2 to 0.7.

3. The resistive random access memory of claim 2, wherein a doping energy of an oxygen ion in the first metal layer is greater than 7 kV to less than 10 kV.

4. The resistive random access memory of claim 1, wherein a material of the second metal layer comprises Ta, Hf or Ti.

5. The resistive random access memory of claim 1, wherein a material of the resistance stabilizing layer comprises a metal oxynitride.

6. The resistive random access memory of claim 1, wherein an oxygen content of the resistance variable layer is 75 atomic percent to 100 atomic percent.

7. The resistive random access memory of claim 1, wherein an oxygen content of the first metal layer is 70 atomic percent to 85 atomic percent.

8. The resistive random access memory of claim 1, wherein an oxygen content of the resistance stabilizing layer is 20 atomic percent to 60 atomic percent.

9. The resistive random access memory of claim 1, wherein an oxygen content of the second metal layer is 10 atomic percent to 40 atomic percent.

10. The resistive random access memory of claim 1, further comprising a barrier layer disposed between the second metal layer and the second electrode.

11. A resistive random access memory comprising:
a first electrode;
a second electrode disposed on the first electrode;
a resistance variable layer disposed between the first electrode and the second electrode;
a first metal layer disposed between the resistance variable layer and the second electrode, wherein a material of the first metal layer comprises $TiO_{2-x}$, $HfO_{2-x}$ or $TaO_{2-x}$, wherein x is 0.2 to 0.7;
a second metal layer disposed between the first metal layer and the second electrode;
a resistance stabilizing layer disposed between the first metal layer and the second metal layer, wherein an oxygen content of the resistance variable layer is higher than an oxygen content of the first metal layer, the oxygen content of the first metal layer is higher than an oxygen content of the resistance stabilizing layer, and the oxygen content of the resistance stabilizing layer is higher than an oxygen content of the second metal layer.

12. The resistive random access memory of claim 11, wherein a doping energy of an oxygen ion in the first metal layer is greater than 7 kV to less than 10 kV.

13. The resistive random access memory of claim 11, wherein a material of the resistance stabilizing layer comprises a metal oxynitride.

14. The resistive random access memory of claim 11, further comprising a barrier layer disposed between the second metal layer and the second electrode.

15. A resistive random access memory comprising:
a first electrode;
a second electrode disposed on the first electrode;
a resistance variable layer disposed between the first electrode and the second electrode;
a first metal layer disposed between the resistance variable layer and the second electrode, wherein a doping energy of an oxygen ion in the first metal layer is greater than 7 kV to less than 10 kV;
a second metal layer disposed between the first metal layer and the second electrode, wherein an atomic number of a metal in the second metal layer is greater than an atomic number of a metal in the first metal layer; and
a resistance stabilizing layer disposed between the first metal layer and the second metal layer, wherein an oxygen content of the resistance variable layer is higher than an oxygen content of the first metal layer, the oxygen content of the first metal layer is higher than an oxygen content of the resistance stabilizing layer, and the oxygen content of the resistance stabilizing layer is higher than an oxygen content of the second metal layer.

16. The resistive random access memory of claim 15, wherein a material of the first metal layer comprises $TiO_{2-x}$, $HfO_{2-x}$ or $TaO_{2-x}$, wherein x is 0.2 to 0.7.

17. The resistive random access memory of claim 15, wherein a material of the second metal layer comprises Ta, Hf or Ti.

18. The resistive random access memory of claim 10, wherein a material of the barrier layer comprises aluminum oxide ($Al_2O_3$), hafnium oxide ($HfO_2$), or zirconium oxide ($ZrO_2$).

19. The resistive random access memory of claim 10, wherein an oxygen content of the barrier layer is higher than the oxygen content of the second metal layer.

\* \* \* \* \*